United States Patent [19]
Akasaka et al.

[11] Patent Number: 5,530,938
[45] Date of Patent: Jun. 25, 1996

[54] NON-VOLATILE MEMORY CARD DEVICE HAVING FLASH EEPROM MEMORY CHIPS WITH DESIGNATED SPARE MEMORY CHIPS AND THE METHOD OF REWRITING DATA INTO THE MEMORY CARD DEVICE

[75] Inventors: Katsumi Akasaka; Kenichi Sato; Yasuyoshi Watanabe, all of Tokyo, Japan

[73] Assignee: Seiko Instruments Inc., Tokyo, Japan

[21] Appl. No.: 14,430

[22] Filed: Feb. 5, 1993

[30] Foreign Application Priority Data

Feb. 5, 1992 [JP] Japan .................... 4-020110

[51] Int. Cl.⁶ .................... G06F 12/02; G06F 13/00
[52] U.S. Cl. .................... 395/430; 364/957.8; 364/965.76; 364/965.79; 364/DIG. 2; 365/218; 371/10.2
[58] Field of Search .................... 365/218; 364/957.8, 364/965.76, 965.79; 371/10.2; 395/430

[56] References Cited

U.S. PATENT DOCUMENTS

| | | | |
|---|---|---|---|
| 5,303,198 | 4/1994 | Adachi et al. | 365/218 |
| 5,341,339 | 8/1994 | Wells | 365/218 |
| 5,355,464 | 10/1994 | Fandrich et al. | 395/425 |
| 5,357,475 | 10/1994 | Hasbun et al. | 365/218 |

*Primary Examiner*—Tod R. Swann
*Assistant Examiner*—Frank J. Asta
*Attorney, Agent, or Firm*—Loeb & Loeb

[57] ABSTRACT

A memory card device and method of rewriting the same which require no separate memory for saving all data in a chip containing data to be rewritten, and in which data are not lost due to a power source failure that may occur during writing operation. Each of a plurality of chips which constitute a memory card is provided with; a logic address, a control region containing a write start number and a write completion number, and a data region. An erased chip is prepared within the memory card device. A write start number in a chip containing data to be rewritten is written, for example, into the erased chip by performing incrementing operation. Data in the data region which is not to be rewritten in a chip containing data to be rewritten are copied into the erased chip and new rewrite data are written into the erased chip. A write completion number in the chip containing data to be rewritten is written, for example, into the erased chip by performing incrementing operation on the write completion number. Finally, the chip which contained data to be rewritten is erased.

10 Claims, 8 Drawing Sheets

NON-VOLATILE MEMORY CARD DEVICE HAVING FLASH EEPROM MEMORY CHIPS WITH DESIGNATED SPARE MEMORY CHIPS AND THE METHOD OF REWRITING DATA INTO THE MEMORY CARD DEVICE

BACKGROUND OF THE INVENTION

1. Field of the Invention

The present invention relates to a memory card device and a method for rewriting data therein, the memory card device being composed of a flash EEPROM which is an electrically erasable, writable, readable non-volatile memory device.

2. Description of the Related Art

In a rewriting operation, if a flash EEPROM chip has already had data written into it, a rewriting operation has to be performed, unlike a RAM chip after all data in the memory chip have been erased.

Conventionally, according to the flow chart shown in FIG. 6, in a case in which data in an area within a chip (shown in FIG. 7) are rewritten, a method has been used which includes: retrieving a chip including data to be rewritten when a rewriting request arrives (step 601); reading out all data in the chip including the data to be rewritten into a memory device to save them (step 602); and erasing the chip including the data to be rewritten (step 603); reading out from the memory device the saved data extending from the head data, or first data from the chip, saved in the step 602 to the data just before data to be rewritten from the memory device, and writing that data into the chip erased in the step 603 (step 604); writing the new rewrite data into the chip erased in the step 603 (step 605); and reading out the data extending from the data just after data to be rewritten to the last data in the data saved in the step 602 from the memory device, and writing them into the chip erased in the step 603 (step 606).

However, there is the problem, in the conventional method of writing to a non-volatile memory card using a flash EEPROM, that an additional memory device for saving all data in a memory chip including rewritten data is required, whereby not only data to be rewritten, but also other data in the chip could be lost due upon the occurrence of a power failure or the like during a rewriting operation.

SUMMARY OF THE INVENTION

In order to overcome the above mentioned problem, it is an object of the present invention to provide a non-volatile memory card device having a flash EEPROM or the like and a method of rewriting the same which require no memory device for saving all data in a chip including data to be rewritten and can avoid a situation in which data originally stored in the device is lost due to a power failure or the like during a writing operation.

The above and other objects are achieved, according to the invention, by a method for rewriting data in a non-volatile memory card device, the non-volatile memory card device being composed of a plurality of non-volatile memory chips, each non-volatile memory chip having a control region having a location for storing a logic address which specifies the non-volatile memory chip, a location for storing write start information, e.g. a write start number, written therein before data data writing to the chip has started, and a location write completion information e.g. a write completion number, written after data writing has been completed, and a data region composed of an ordered group of addressable memory locations for storing data, including a first memory location and a last memory location, the method comprising the steps of:

establishing a first one of the memory chips as a spare memory chip which is in a fully erased condition;

in response to appearance of a rewrite request indicating that a portion of the data stored in the data region of a second one of the memory chips is to be rewritten, addressing the second memory chip which contains data to be rewritten, based on the logic address stored in the second chip, and addressing the first one of the memory chips;

performing a specific operation on the write start information stored in the second memory chip and storing the result of the specific operation as write start information in the control region of the first memory chip;

copying data stored in the data region of the second memory chip between the first memory location and the memory location just in front of the memory locations containing data to be rewritten into a first part of the data region of the first memory chip, writing desired rewrite data into a second part of the data region of the first memory chip, copying data stored in the data region of the second memory chip between the memory location just after the memory locations containing the data to be rewritten and the last memory location covering into a third part of the data region of the first memory chip, and writing the logic address of the second memory chip into the control region of the first memory chip as the logic address of the first memory chip; and performing the specific operation on the write completion information stored in the second memory chip and storing the result of the specific operation as write completion information in the control region of the first memory chip.

In the non-volatile memory card rewriting method as described above, an erased chip is preliminarily prepared within a non-volatile memory card, and at first, a write start number in a memory chip containing data to be rewritten is written to a control region in the erased chip, for instance, by performing an increment. Then, data in a region of the chip not to be rewritten, including the data to be rewritten, are copied to the erased chip and new rewrite data are written in the erased chip. Next, a write completion number in the chip including the data to be rewritten is written in, for the control region of the previously erased chip for instance, by performing an increment. Finally, the chip, which contains the data to be rewritten is erased.

DESCRIPTION OF THE PREFERRED EMBODIMENTS

The preferred embodiment of the present invention will be described below with reference to the drawings. It is to be understood that the selected embodiment is merely exemplary of the invention.

Figure 1:
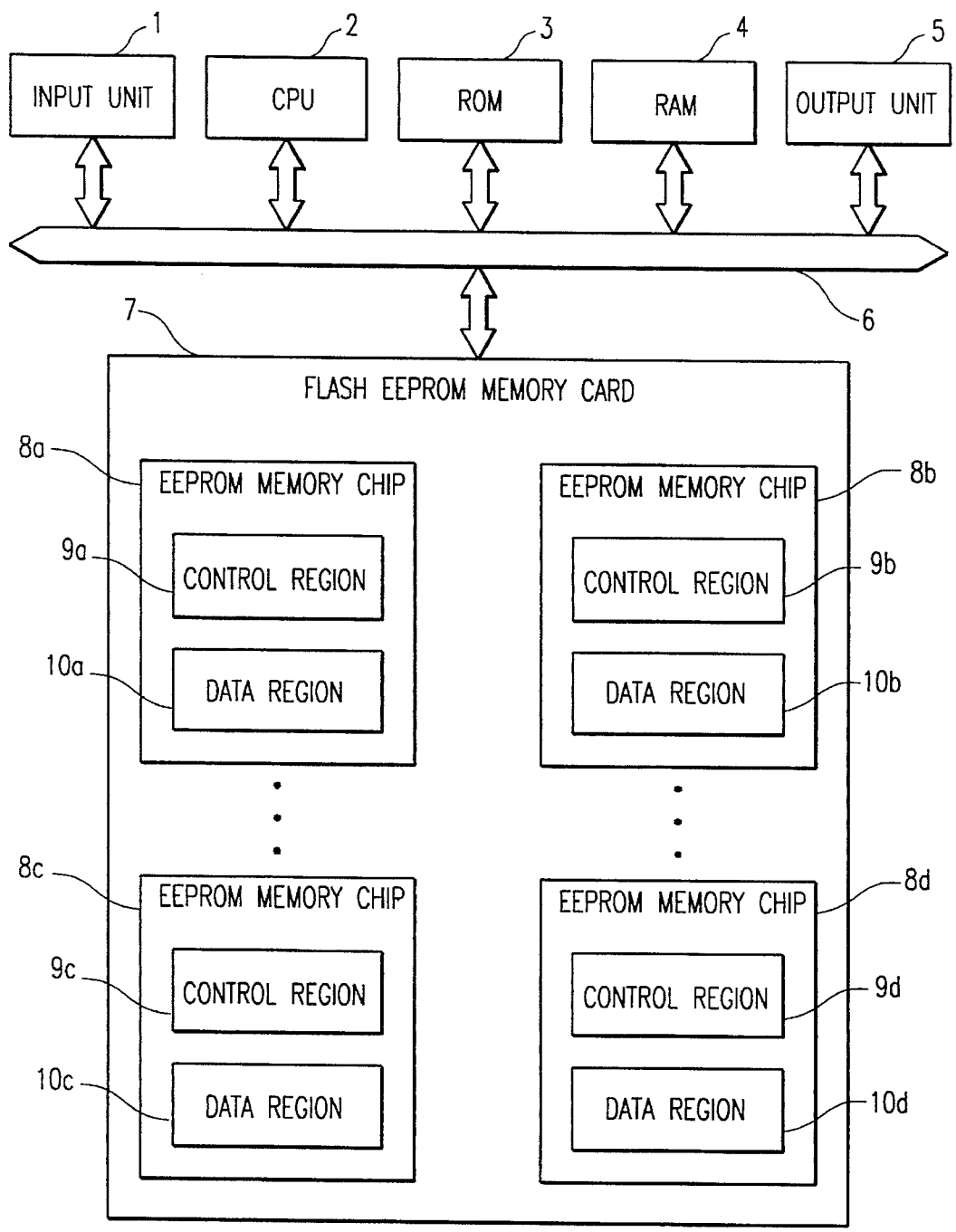
FIG. 1 is a block diagram of a system for rewriting a flash EEPROM memory card according to the present invention.

FIG. 1 is a block diagram of a flash EEPROM memory card and a system for rewriting the same according to the present invention.

An input unit 1 inputs data for rewriting a flash EEPROM memory card 7. A CPU 2 reads out instructions from a ROM 3 or a RAM 4 in which programs constituting operational procedure for the system is stored, performs various arithmetic processing operations, and controls reading out and writing of data with respect to flash EEPROM memory card 7. In addition to the above functions, RAM 4 is also used as a data domain, or region, for the CPU 2 carrying out various arithmetic processing operations. An output unit 5 can also display the contents of the flash EEPROM memory card 7. Numeral 6 represents a bus interconnecting all of the system components.

Flash EEPROM memory card 7 is composed of a plurality of flash EEPROM memory chips 8. In the drawing there are shown four flash EEPROM memory chips 8a, 8b, 8c and 8d, although it will be understood that such a memory card can have more than four such chips. Each flash EEPROM memory chip 8 is divided into a control domain, or region, 9 having a logic address, a write start number, and a write completion number, and a data domain, or region, 10 for storing general data. Regions 9 and 10 may be physically distinct regions or may simply be functionally differentiated.

Figure 2:
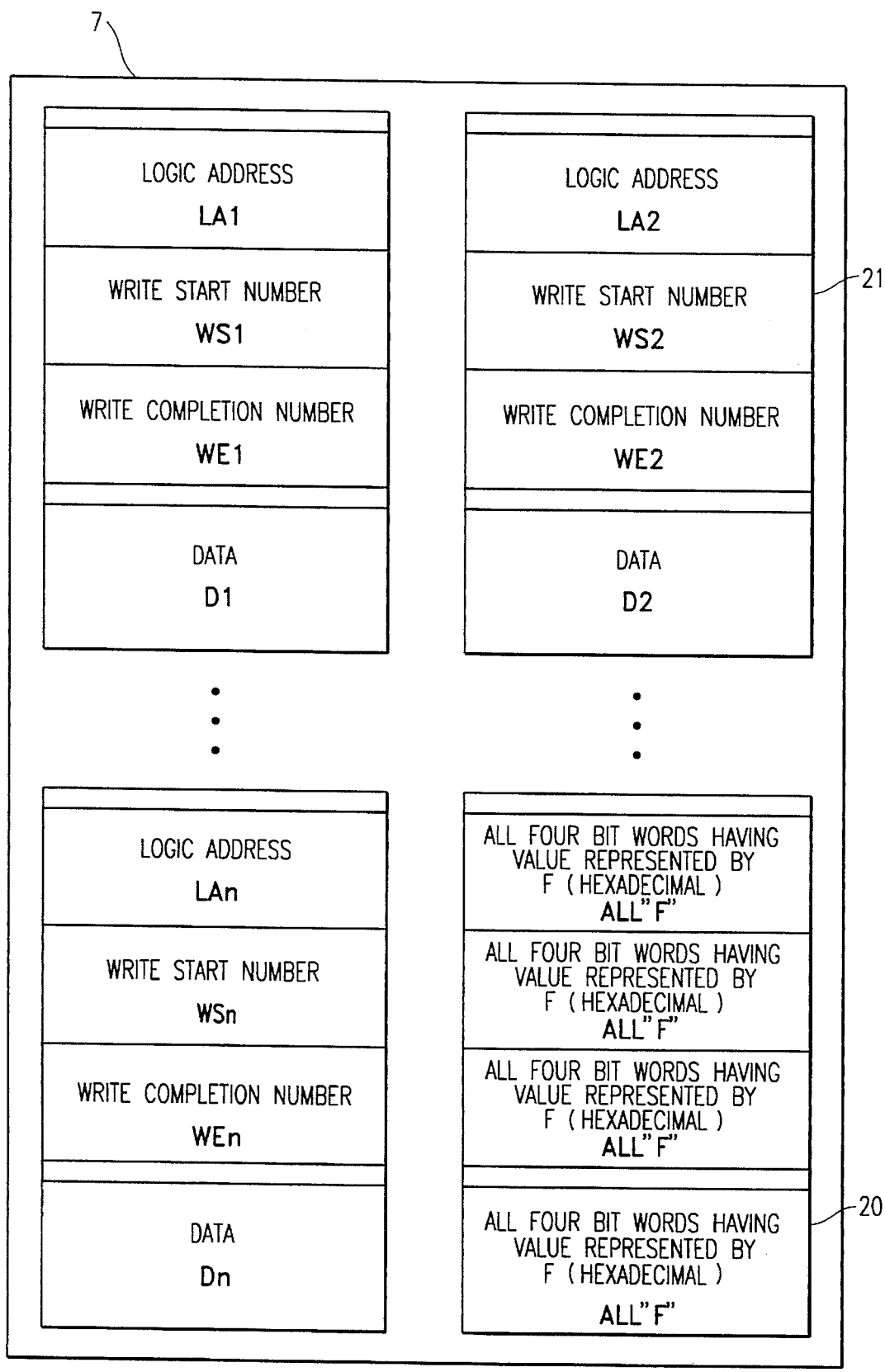
FIG. 2 is a memory map showing the contents of a flash EEPROM memory card.

The operation of a device according to the present invention will be explained referring to FIGS. 2, 3, and 4. FIG. 2 shows a memory map in the flash EEPROM memory card 7.

Figure 3A:
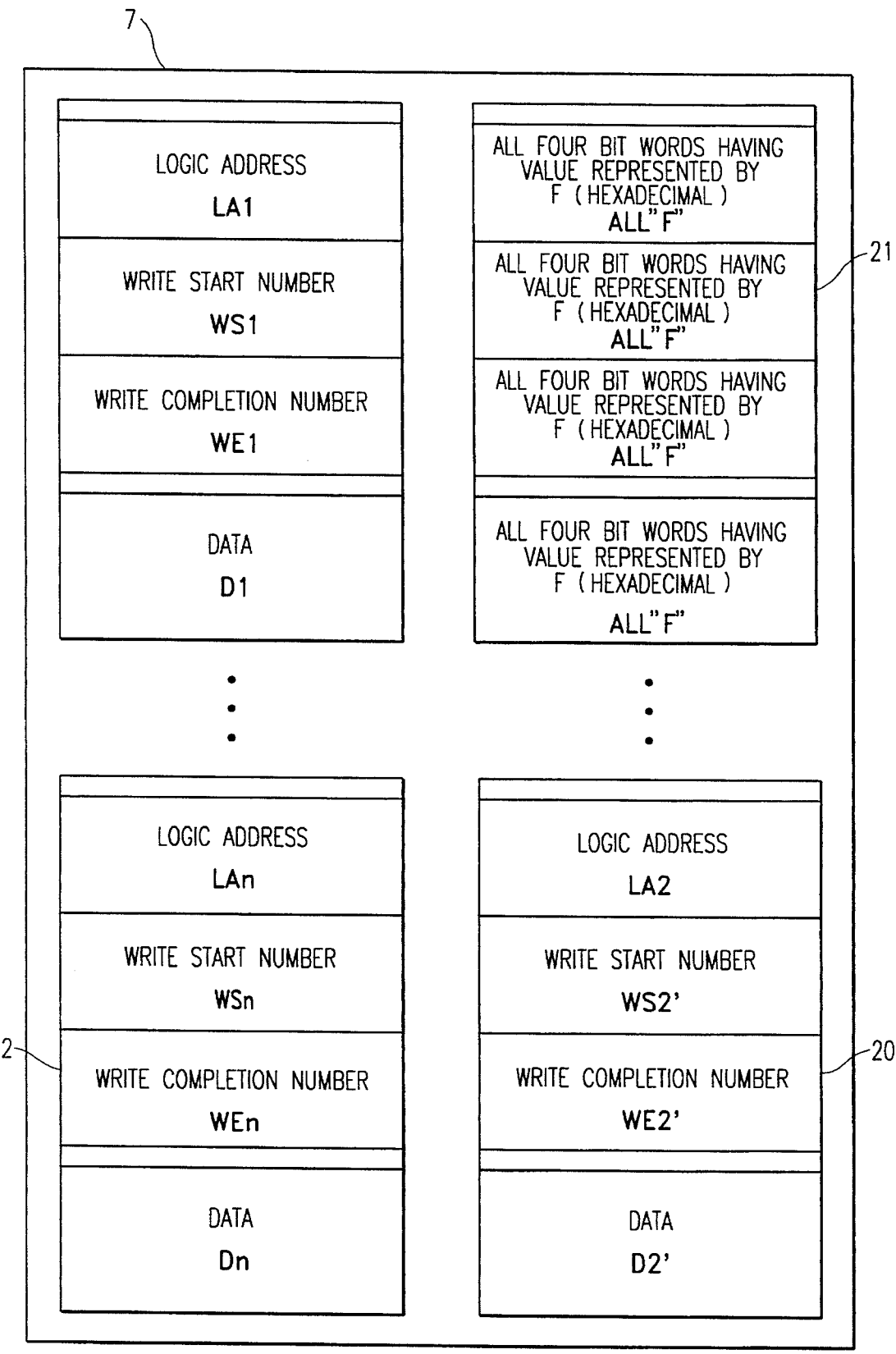
FIGS. 3(a) and 3(b) are memory maps showing the contents of a flash EEPROM memory card after various rewriting operations according to the present invention.
Figure 3B:
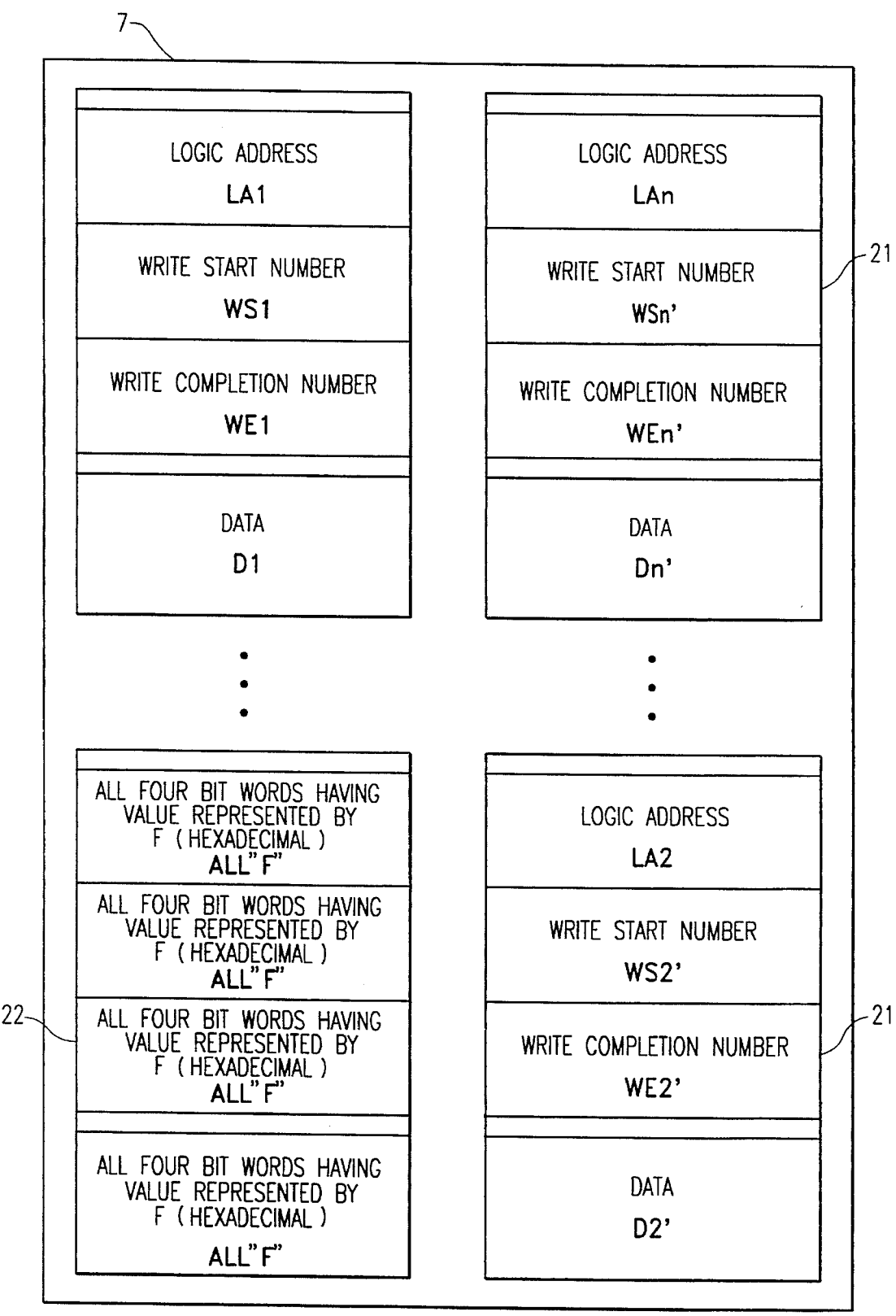

FIG. 3(a) shows a memory map at a time when the flash EEPROM memory card 7 has been rewritten a first time according to the present invention, and FIG. 3(b) shows a memory map at time when the flash EEPROM memory card 7 has been rewritten a second time according to the present invention.

Figure 4:
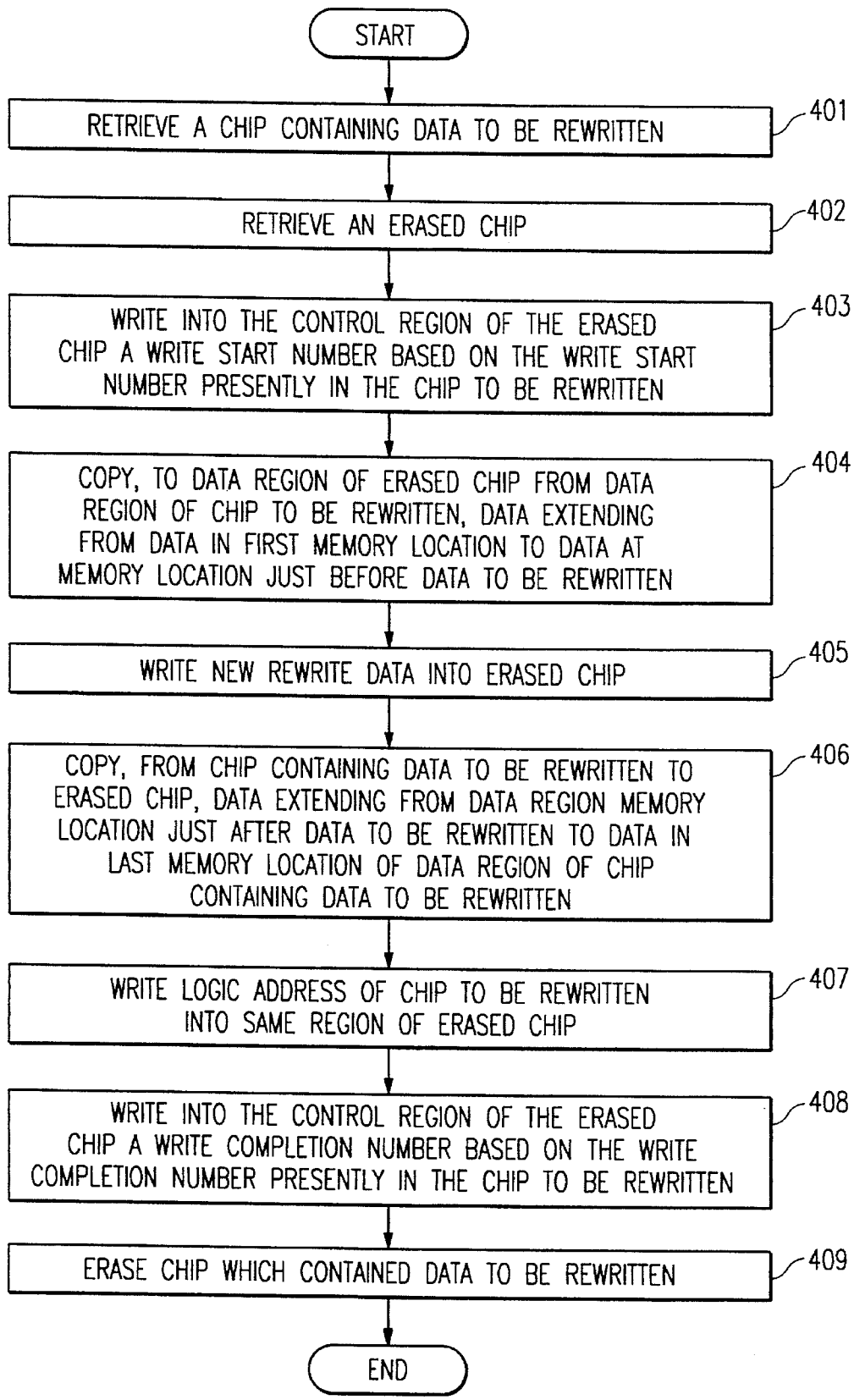
FIG. 4 is a flow chart showing an operational procedure for rewriting a flash EEPROM memory card according to the present invention.

FIG. 4 is a flow chart showing a rewriting operation procedure for the flash EEPROM memory card 7 according to the present invention. In FIGS. 2 and 3, LA1, LA2, ... LAn are the logic addresses for specifying a chip having data to be rewritten. WS1, WS2,... WSn are write start numbers indicating that a writing operation has been started. WE1, WE2, ... WEn are write completion numbers indicating that a writing operation has been completed. D1, D2, . . . Dn represent data.

Before a writing operation starts, the logic address has to be initialized to the value to be determined unconditionally in the flash EEPROM memory card 7. In addition, the write start number and the write completion number have to be initialized so as to have a certain relation in the chip, for instance to be equal. In this case, the chip 20 within the flash EEPROM memory card 7 of FIG. 2 was erased previously. In the erased chip 20, the logic address, the write start number, the write completion number and all data consist of a specific bit pattern after erasure. In FIGS. 2 and 3, the specific pattern after erasure is one in which all bits become binary "1" and this being expressed as all "F" i.e. all four-bit words having a value represented by F(hexadecimal).

The rewriting operation procedure of the flash EEPROM memory card 7 according to the present invention will be explained with reference to the flow chart in FIG. 4.

When new rewrite data is inputted from the input unit 1 in FIG. 1, CPU 2 "retrieves" or addresses, a chip containing data to be rewritten by identifying a logic address in the chip (step 401). In FIG. 2, it is assumed that the chip 21 is a chip which contains desired data to be rewritten, the data to be written being all or part of data D2. Chip 21 also has a logic address LA2, a write start number WS2, and a write completion number WE2.

With respect to an erased chip, such chip is addressed based on a specific logic address (step 402). In FIG. 2, chip 20 is a previously erased chip.

A specific operational result, for example, the result of an increment or decrement operation on the write start number WS2 in chip 21, which contains the data to be rewritten, is written to the write start number region in the erased chip 20 (step 403). Number WS2' in the chip 20 shown in FIG. 3(a) is the write start number written in step 403.

The data extending from the first data, i.e. the data in the first memory location, of data region D2 to the data at the memory location just before the data to be rewritten of data region D2 in chip 21, which data region contains data to be rewritten, are copied into the data region of erased chip 20 (step 404). Then, in step 405, new rewrite data sent from CPU 2 in FIG. 1 are written into the data region of chip 20 after the data written in during step 404.

Then data extending from the data in the data region memory location just after the data to be rewritten to the last data, i.e. the data in the last memory location of the data region D2 in chip 21, are copied to the chip 20 which had been already erased (step 406). The logic address LA2 in the chip 21, which chip contains the data to be rewritten, is written into the control region of chip 20 which was previously erased (step 407).

As shown in FIG. 3(a), LA2 in chip 20 is a logic address written in the step 407. The result obtained by performing the same operation as in step 403 to the write completion number of the chip 21 containing the data to be rewritten is written into the control region of the erased chip 20 (step 408).

In FIG. 3(a), WE2' in chip 20 is a write completion number written in the step 408. The chip 21, which originally contained the data to be rewritten, has been erased (step 409). FIG. 3(a) shows the state in which chip 21 has been erased in step 409.

According to the above mentioned procedure, data D2 which existed in the chip 21 in FIG. 2 are rewritten and then transferred into the chip 20 in FIG. 3(a), where they thus become data D2'. Since the newly rewritten chip 20 has the same logic address (LA2) that chip 21 had before its erasure, data D2' can be read out properly.

To continue the example, it is assumed now that a request has come into the system to rewrite the data in the chip 22 from the state in FIG. 3(a). The result shown in FIG. 3(b) is obtained if the operation procedure shown in FIG. 4 is repeated. That is, the logic address LAn shown in FIG. 3(a) and data stored in the chip 22 including the write start number WSn and the write completion number WEn are transferred to the chip 21 shown in FIG. 3(b). Here, the write start number is converted into WSn' and the write completion number is converted into WEn'. However, since the logic address LAn remains unchanged, rewritten data can be read out properly from chip 21. Then the chip 22 is erased and is available for a following rewriting operation.

In the above explanation, there is not any problem if the procedures of step 401 and step 402 are reversed. In addition, there is also no problem if order of steps 404 through 407 shown in FIG. 4 is changed. Furthermore, there is no requirement that the chip erasing procedure in step 409 of FIG. 4 must be performed immediately after the step 408, it may be performed any time during before the chip in question is needed for another rewriting operation. Hence, the operation associated with a request for rewriting is completed by step 408 of FIG. 4, and it is sufficient that CPU 2 may erase the chip in step 409 during an idle time prior to the next rewriting request. Thereby, the time to be taken for rewriting can be reduced apparently by the chip erasing time in the step 409. In the above mentioned embodiment, card 7 is provided with a single erased chip, but it may be provided with a plurality of erased chips.

As is apparent from the above operation description, the chip containing rewrite data is not erased until the completion of rewriting. Since the chip is formed in an EEPROM, data are not lost even if a power failure occurs during a rewriting operation.

Figure 5:
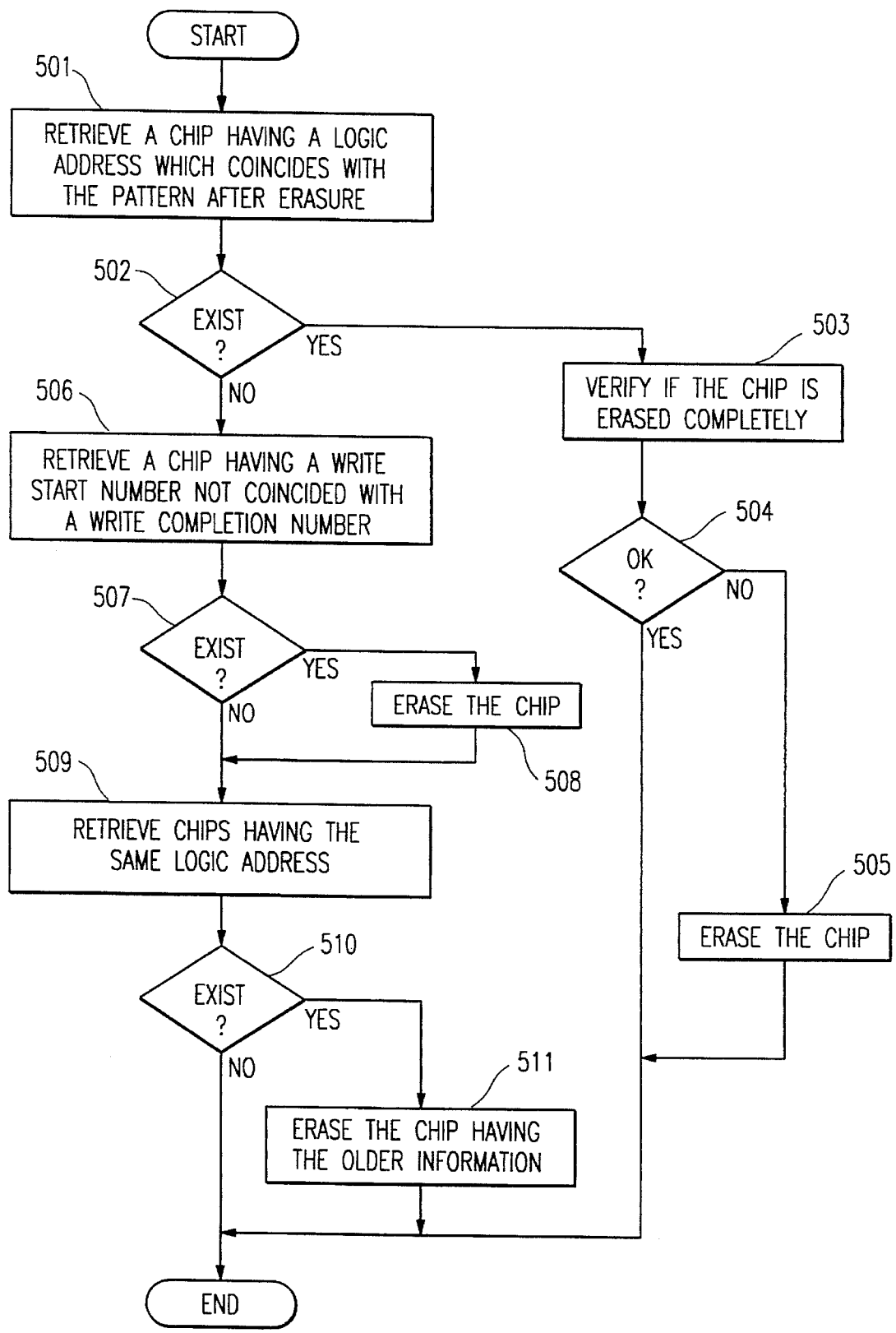
FIG. 5 is a flow chart showing a recovering operation after a power failure has occurred during a rewriting operation according to the present invention.
Figure 6:
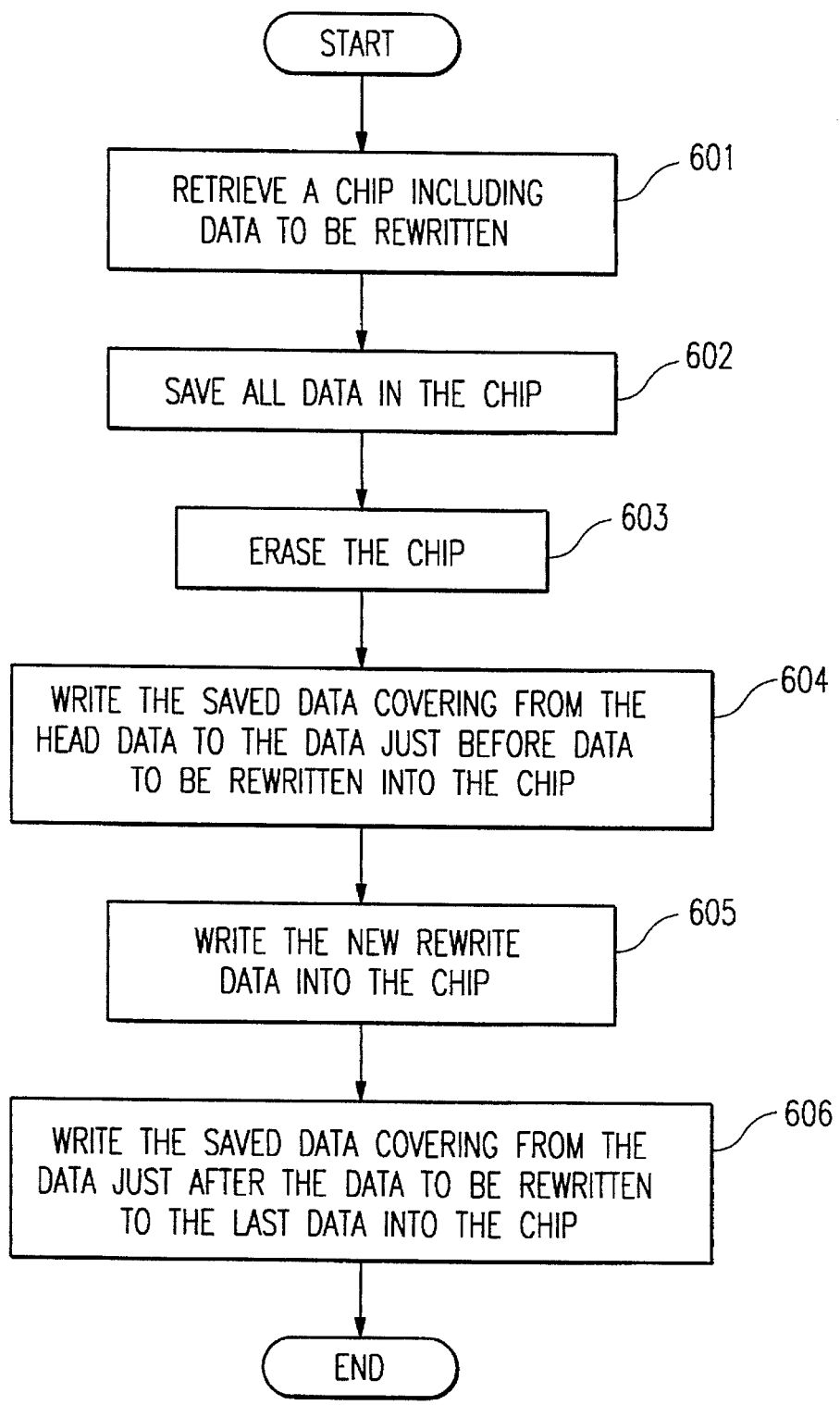
FIG. 6 is a flow chart showing a conventional rewriting operation for a flash EEPROM memory card.
Figure 7:
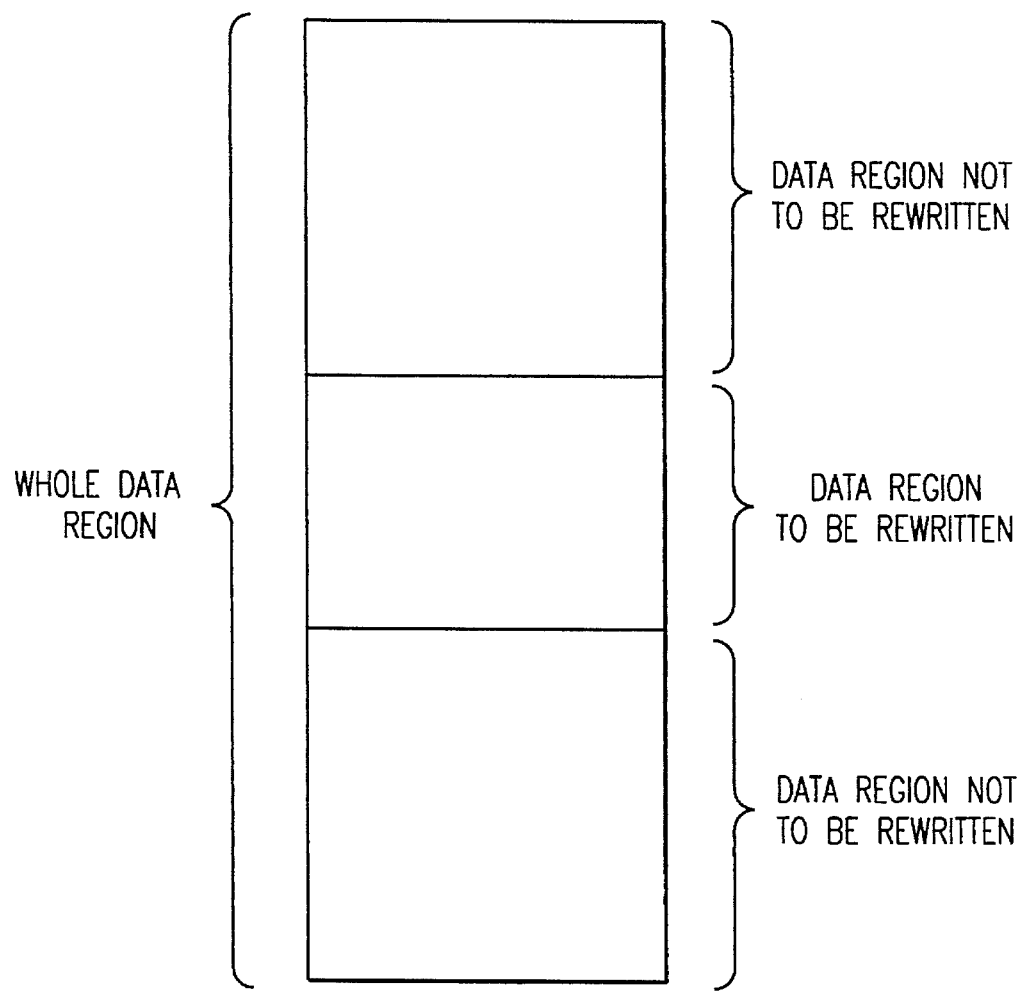
FIG. 7 is a schematic view showing a data domain within a memory chip.

FIG. 5 is a flow chart showing a recovering procedure after a power source has failed during a rewriting operation.

After a power source has failed during a rewriting operation, then, during the period from a power reset time to a first rewriting time, a determination is made whether there is a chip with a logic address which coincides with the specific pattern after erasure applicable for all chips (step 501). If a logic address coincides with the pattern after erasure (step 502), it is confirmed whether the relevant chip is completely erased or not, in consideration of a possibility that power has failed during the chip erasing procedure in the step 409 shown in FIG. 4 (step 503).

If the erasure confirmation indicates that the relevant chip has not been erased properly (step 504), the relevant chip is erased over again (step 505). In the step 502, if a logic address which coincides with the specific pattern after erasure is not found, there is a probability that power source failure occurred during rewriting operation in the steps 403 to 408. If a power source failed during the rewriting operation shown in FIG. 4, the write start number does not coincide with the write completion number. Hence, the chip in which the write start number and the write completion number do not coincide with one another is found (step 506). When the retrieval of the step 506 has found the chip in which the write start number and the write completion number did not coincide with each other (step 507), the chip is erased (step 508).

Through this procedure, a chip which was in the middle of writing is erased and becomes reusable. In this case, since power failure occurred before the erasing operation in the step 409 shown in FIG. 4 has been performed, the data in the chip containing data which was intended to be rewritten remains as it was. In the case where the power source has failed during a transient time period between step 408 and step 409, chips which have the same logic address exist, whereby it is explained that the write start number and the write completion number coincide in the chip.

Hence, by assuming the above case, retrieving chips which have the same logic address (step 509), in the case where chips which have the same logic address exist (step 510), the chip which is judged that the write start number or the write completion number to be older among the two chips by comparing each other by arithmetic operation of the step 403 or the step 408 in FIG. 4 is erased. In this case, the result after rewriting is left. Besides, in FIG. 5, the order of the operations of the steps 506, 507, and 508 and the operations of the steps 509, 510, and 511 is interchangeable.

As described above, even if a power failure occurs during a rewriting operation, data involved in the rewriting operation can be recovered without being lost.

The present invention, as explained above, permits a system to eliminate a memory unit for saving all data from a chip, including rewrite data, by using the method in which: a chip which has been completely erased is prepared preliminarily within a flash EEPROM memory card, a chip whose data has been completely rewritten is erased every rewriting, and the latter chip is prepared for use in the next rewriting operation. Since an erasing operation can be performed at some time after completion of a rewriting operation, there is the result that data are not lost even if the power source has failed during a rewriting operation. Furthermore, since a chip can be erased at an optional timing in which the CPU is free during a period from completion of writing to the next writing request, rewriting processing time for one rewriting request is shortened effectively by the chip erasing processing time.

This application relates to subject matter disclosed in Japanese Application number 4-20110, filed on Feb. 5, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A memory card device which can perform erasing, writing, and reading out of data electrically, the memory card device comprising:

at least one non-volatile memory chip comprising: a control region which includes a location for storing a logic address to specify said non-volatile memory chip, a location for storing write start information written therein before data writing to said non-volatile memory chip has started, and a location for storing write completion information written after the data writing has been completed; and a data region for storing data; and at least one spare non-volatile memory chip having an erased state as an initial state, comprising a control region which includes locations for storing a logic address, write start information, and write completion information; and a data region for storing data.

2. A memory card device according to claim 1, wherein said non-volatile memory is a flash type EEPROM.

3. A method for rewriting data in a non-volatile memory card device, the non-volatile memory card device being composed of a plurality of non-volatile memory chips, each non-volatile memory chip having a control region and a data region, with the control region storing a logic address which specifies the non-volatile memory chip, write start information written before data writing has started, and write completion information indicating that the data writing has been completed, and the data region being composed of an ordered group of addressable memory locations for storing data, including a first memory location and a last memory location, the method comprising the steps of:

(a) establishing a first one of the memory chips as a spare memory chip which is in a fully erased condition;

(b) in response to a rewrite request sent from outside of said non-volatile memory card device indicating that a portion of the data stored in the data region of a second one of the memory chips is to be rewritten, addressing the second memory chip which contains data to be rewritten, based on the logic address stored in the second chip, and addressing the first one of the memory chips;

(c) performing a specific operation on the write start information stored in the second memory chip to change the information and storing the result of the specific operation as write start information in the control region of the first memory chip;

(d) copying data stored in the data region of the second memory chip between the first memory location and the memory location just in front of the memory locations containing data to be rewritten into a first part of the data region of the first memory chip, writing desired rewrite data into a second part of the data region of the first memory chip, copying data stored in the data region of the second memory chip between the memory location just after the memory locations containing the data to be rewritten and the last memory location into a third part of the data region of the first memory chip, and writing the logic address of the second memory chip into the control region of the first memory chip as the logic address of the first memory chip; and (e) performing the specific operation on the write completion information stored in the second memory chip and storing the result of the specific operation as write completion information in the control region of the first memory chip.

4. A data rewriting method for a non-volatile memory according to claim 3, wherein the write start information is a write start number and the write completion information is a write completion number and the specific operation is a numeric value incrementing operation.

5. A data rewriting method for a non-volatile memory according to claim 3, wherein the write start information is a write start number and the write completion information is a write completion number and the specific operation is a numerical value decrementing operation.

6. A data rewriting method for a non-volatile memory according to claim 3, comprising the further step of setting the write start information to be identical to the write completion information in each non-volatile memory chip before said step (b).

7. A data rewriting method for a non-volatile memory according to claim 3, comprising, after said step (e), the further step of fully erasing the second memory chip so that the second memory chip can be subsequently used as a first memory chip.

8. A data rewriting method for a non-volatile memory according to claim 3, wherein the non-volatile memory is a flash type EEPROM.

9. A data rewriting method for a non-volatile memory according to claim 3, further comprising, before performing said steps (a) to (e), detecting an operating power failure by:

determining whether a logic address of a chip coincides with the fully erased state;

in response to a determination that there exists a memory chip with a logic address coinciding with the fully erased state, determining whether that chip is fully erased; and in response to a determination that the chip is not fully erased, fully erasing that chip.

10. A data rewriting method for a non-volatile memory according to claim 3, further comprising, before performing said steps (a) to (e), detecting an operating power failure by:

determining whether a logic address of a chip coincides with the fully erased state;

in response to a determination that no memory chip has a logic address which coincides with the fully erased state, determining whether any memory chip contains write start information different from completion information;

in response to a determination that a chip contains write start information different from write completion information, fully erasing that chip;

in response to a determination that no chip contains write start information different from write completion information, determining whether two chips have the same logic address; and in response to a determination that two chips have the same logic address, erasing a selected one of the two chips based on a comparison of the write start information or write completion information in the two chips.

* * * * *